(12) United States Patent
Lu

(10) Patent No.: US 11,195,593 B2
(45) Date of Patent: *Dec. 7, 2021

(54) HAMMING-DISTANCE ANALYZER AND METHOD FOR ANALYZING HAMMING-DISTANCE

(71) Applicant: TAIWAN SEMICONDUCTOR MANUFACTURING CO., LTD., Hsinchu (TW)

(72) Inventor: Shih-Lien Linus Lu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 3 days.

This patent is subject to a terminal disclaimer.

(21) Appl. No.: 16/726,046

(22) Filed: Dec. 23, 2019

(65) Prior Publication Data

US 2020/0135294 A1 Apr. 30, 2020

Related U.S. Application Data

(63) Continuation of application No. 16/011,215, filed on Jun. 18, 2018, now Pat. No. 10,515,713, which is a (Continued)

(51) Int. Cl.
*G11C 29/56* (2006.01)
*G11C 29/14* (2006.01)
(Continued)

(52) U.S. Cl.
CPC ...... *G11C 29/56008* (2013.01); *G11C 29/028* (2013.01); *G11C 29/14* (2013.01);
(Continued)

(58) Field of Classification Search
CPC . G11C 29/56008; G11C 29/028; G11C 29/52; G11C 29/26; G11C 29/56016;
(Continued)

(56) References Cited

U.S. PATENT DOCUMENTS 5,951,711 A * 9/1999 Mahant-Shetti .... G06F 11/0754
326/52
6,128,358 A * 10/2000 Urata ................. G11B 20/1426
375/359
(Continued)

FOREIGN PATENT DOCUMENTS

JP 3766993 B2 4/2006

*Primary Examiner* — Thien Nguyen
(74) *Attorney, Agent, or Firm* — Maschoff Brennan

(57) ABSTRACT

A device is disclosed for testing a memory, in which the memory includes a first memory circuit and a second memory circuit. The second memory circuit is configured to store a first response in responses of the first memory circuit, and the first memory circuit is configured to store a second response of responses of the second memory circuit. The device includes a comparing circuit and a maximum hamming distance generating circuit. The comparing circuit is configured to compare the first response with the responses of the first memory circuit, and configured to compare the second response with the responses of the second memory circuit, to generate comparing results. The maximum hamming distance generating circuit is configured to generate a maximum hamming distance according to the comparing results.

20 Claims, 5 Drawing Sheets

Related U.S. Application Data continuation-in-part of application No. 15/419,470, filed on Jan. 30, 2017, now Pat. No. 10,515,710.

(60) Provisional application No. 62/426,773, filed on Nov. 28, 2016.

(51) Int. Cl.

| | |
|---|---|
| *G11C 29/38* | (2006.01) |
| *G11C 29/02* | (2006.01) |
| *G11C 29/52* | (2006.01) |
| *G11C 29/26* | (2006.01) |
| *G11C 29/44* | (2006.01) |

(52) U.S. Cl.
CPC ............. *G11C 29/26* (2013.01); *G11C 29/38* (2013.01); *G11C 29/52* (2013.01); *G11C 29/56016* (2013.01); *G11C 2029/2602* (2013.01); *G11C 2029/4402* (2013.01)

(58) Field of Classification Search
CPC . G11C 29/14; G11C 29/38; G11C 2029/2602; G11C 2029/4402
See application file for complete search history.

(56) References Cited

U.S. PATENT DOCUMENTS

| | | | |
|---|---|---|---|
| 6,625,225 | B1 | 9/2003 | Fukuda |
| 8,339,824 | B2 | 12/2012 | Cooke |
| 2003/0014634 | A1 | 1/2003 | Petrovic |
| 2003/0182603 | A1 | 9/2003 | Gass |
| 2005/0184742 | A1 | 8/2005 | Huang et al. |
| 2005/0257104 | A1 | 11/2005 | Wood |
| 2006/0212555 | A1 | 9/2006 | Harada |
| 2012/0246494 | A1 | 9/2012 | Gebara et al. |
| 2013/0133031 | A1 | 5/2013 | Fainstein et al. |
| 2014/0240014 | A1 | 8/2014 | Yamakawa |
| 2014/0351667 | A1 | 11/2014 | Gadat |
| 2016/0063510 | A1* | 3/2016 | Simske ................ G06Q 10/087 235/375 |

\* cited by examiner

HAMMING-DISTANCE ANALYZER AND METHOD FOR ANALYZING HAMMING-DISTANCE

RELATED APPLICATIONS

This application is a continuation of the U.S. application Ser. No. 16/011,215, filed Jun. 18, 2018, now U.S. Pat. No. 10,515,713, issued Dec. 24, 2109, which is a continuation-in-part of U.S. patent application Ser. No. 15/419,470, filed Jan. 30, 2017, now U.S. Pat. No. 10,515,710, issued Dec. 24, 2019, which claims priority of U.S. Provisional Application Ser. No. 62/426,773, filed Nov. 28, 2016, all of which are herein incorporated by reference.

BACKGROUND

Due to many manufacturing factors, each one of integrated circuits (ICs) is unique even though the ICs are manufactured with the same manufacturing process and the same materials. Each one of ICs has a chance to operate in different operating environments according to its practical applications. Thus, a robustness of one of ICs in different operating environments becomes a critical issue in a field of a semiconductor technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
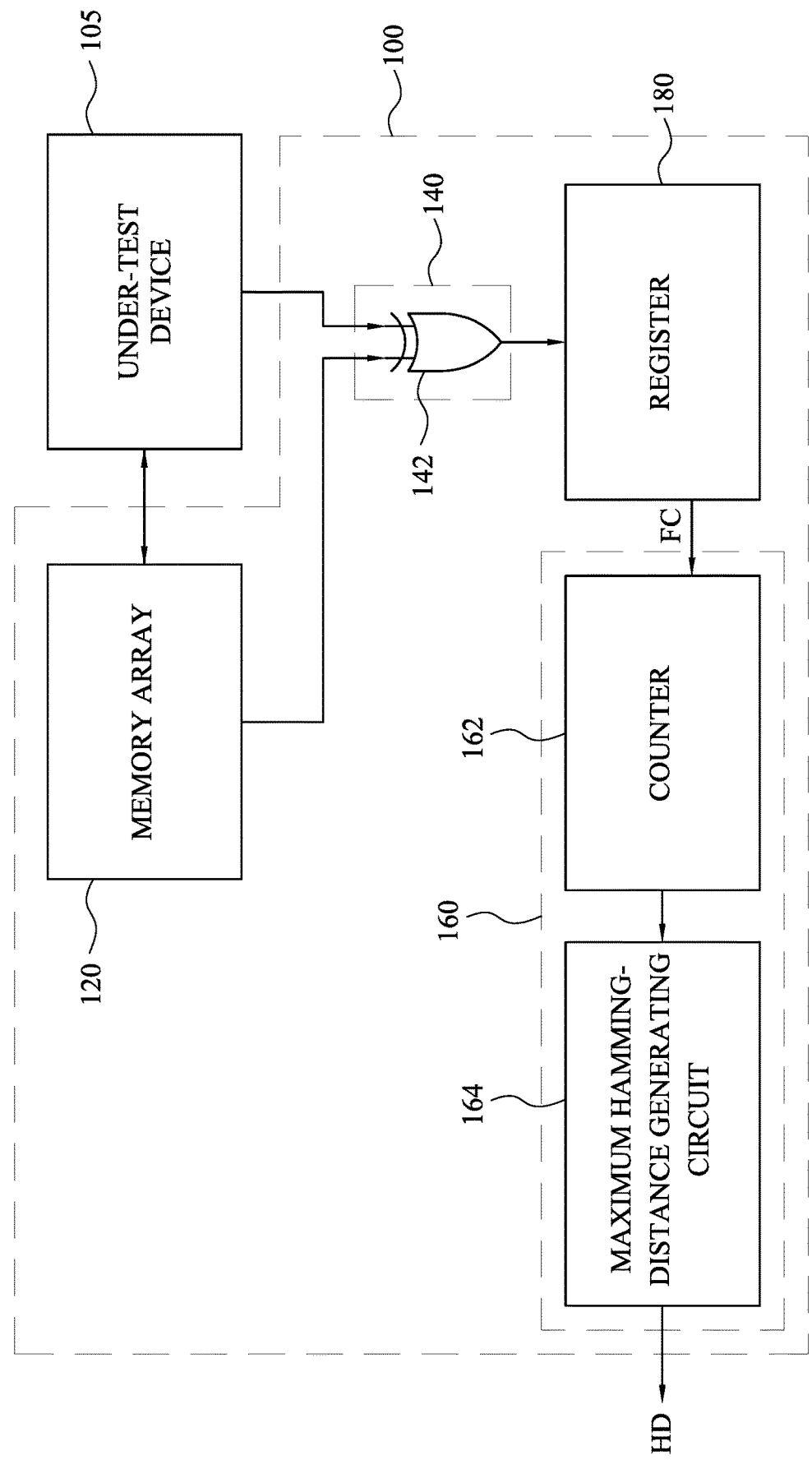
FIG. 1 is a schematic diagram of a device and an under-test device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

The terms "comprise," "comprising," "include," "including," "has," "having," etc. used in this specification are open-ended and mean "comprises but not limited."

Reference is now made to FIG. 1. FIG. 1 is a schematic diagram of a device 100 and an under-test device 105, in accordance with various embodiments of the present disclosure.

In some embodiments, the device 100 is a test device. The device 100 is configured to test a robustness of the under-test device 105. In some embodiments, the device 100 is applied in, or implemented as, an intra-hamming distance analyzer. The device 100 is configured to generate a maximum hamming distance HD of the under-test device 105. The maximum hamming distance HD represents the robustness of the under-test device 105. In some embodiments, the hamming distance HD indicates a number of bits that are different between two binary strings.

In some embodiments, the under-test device 105 is an under-test memory array. In some other embodiments, the under-test device 105 includes an under-test memory array. The under-test memory array is, for example, a static random access memory (SRAM), a flash, or the like, but is not limited thereto. Various memory arrays or units used to implement or implemented in the under-test device 105 are within the contemplated scope of the present disclosure.

In some embodiments, the under-test device 105 operates in different operating conditions according to its practical applications. The operating conditions are corresponding to different operating environments. For illustration, different operating conditions correspond to different supply voltages, different operating temperatures, different operating frequencies, or the combination thereof.

In some embodiments, when the under-test device 105 operates in different operating conditions, responses of the under-test device 105 are different. In some embodiments, each one of the responses is the content in the under-test device 105 in a specific operating environment. For illustration, a response of the under-test device 105 operating under 10° C. is different from a response of the under-test device 105 operating under 50° C.

The aforementioned operating conditions are given for illustrative purposes only. Various operating conditions are within the contemplated scope of the present disclosure.

As illustratively shown in FIG. 1, in some embodiments, the device 100 includes a memory array 120, a comparing circuit 140, and a calculating circuit 160. In some embodiments, the device 100 further includes a register 180. The memory array 120 is coupled to the under-test device 105. The comparing circuit 140 is coupled to the memory array 120 and the under-test device 105. The register 180 is coupled to the comparing circuit 140. The calculating circuit 160 is coupled to the register 180.

The above discussion merely describes exemplary connections that can be made in accordance with various alternative embodiments. It is understood that such various alternative embodiments are not limited to the specific connections described above or those shown in FIG. 1.

In addition, in this document, the term "coupled" may also be termed as "electrically coupled," and the term "connected" may be termed as "electrically connected". "Coupled" and "connected" may also be used to indicate that two or more elements cooperate or interact with each other.

As illustratively shown in FIG. 1, the memory array 120 is configured to generate at least one response of the under-test device 105, and to store the at least one response. In some embodiments, the at least one response is copied or duplicated from the under-test device 105 into the memory array 120. In some embodiments, the memory array 120 is a duplicate of the under-test device 105, and accordingly, the memory array 120 generates at least one response which is the same as that from the under-test device 105.

In some embodiments, a storing capacity of the memory array 120 corresponds to a bit number of the at least one response of the under-test device 105. For example, if the at least one response of the under-test device 105 has n bits, the storing capacity of the memory array 120 has at least n bits.

As illustratively shown in FIG. 1, the comparing circuit 140 receives the response from the memory array 120. The comparing circuit 140 also receives responses, obtained in different operating conditions, from the under-test device 105. The comparing circuit 140 is configured to compare the response from the memory array 120 with the responses from the under-test device 105 sequentially, to generate corresponding comparing results.

As illustratively shown in FIG. 1, in some embodiments, the comparing circuit 140 includes at least one exclusive OR gate 142. The exclusive OR gate 142 has a first input terminal, a second input terminal, and an output terminal. The first input terminal is coupled to the memory array 120, to receive the response from the memory array 120. The second input terminal is coupled to the under-test device 105, to receive the responses, obtained in different operating conditions, from the under-test device 105. The output terminal of the exclusive OR gate 142 is coupled to the register 180.

The exclusive OR gate 142 is configured to perform an exclusive OR operation of the response from the memory array 120 and the responses from the under-test device 105 sequentially, to generate the corresponding comparing results. These comparing results are outputted to the register 180.

The arrangements of the comparing circuit 140 are given for illustrative purposes only. Various arrangements of the comparing circuit 140 are within the contemplated scope of the present disclosure. For example, in some other embodiments, the comparing circuit 140 includes more than one exclusive OR gates, and in alternative embodiments, the comparing circuit 140 includes a number of exclusive OR gates that correspond to a same number of the responses from the under-test device 105. In some other embodiments, the comparing circuit 140 is implemented by other logic elements.

As illustratively shown in FIG. 1, the register 180 is configured to temporarily store the comparing results generated from the comparing circuit 140. Then, the register 180 generates a final comparing result FC according to the comparing results. In some embodiments, the final comparing result FC indicates a comparing result which is generated by comparing the response from the memory array 120 with a final response from the under-test device 105.

The numbers of the register 180 are given for illustrative purposes only. Various numbers of the register 180 are within the contemplated scope of the present disclosure. In some other embodiments, the device 100 includes more than one registers. For example, in some other embodiments, the device 100 includes two registers. First register of the two registers is coupled to the comparing circuit 140, to temporarily store a comparison of two corresponding bits from the comparing circuit 140. Second register of the two registers is coupled to the first register and configured to generate the final comparing result FC according to a plurality of the comparisons of different two corresponding bits from the first register.

As illustratively shown in FIG. 1, the calculating circuit 160 is configured to receive the final comparing result FC from the register 180. The calculating circuit 160 is further configured to output the maximum hamming distance HD according to the final comparing result FC. The maximum hamming distance HD represents a maximum difference between two of the responses from the under-test device 105.

As illustratively shown in FIG. 1, in some embodiments, the calculating circuit 160 includes a counter 162 and a maximum hamming distance generating circuit 164. The counter 162 is coupled to the register 180. The maximum hamming distance generating circuit 164 is coupled to the counter 162.

The counter 162 is configured to receive the aforementioned final comparing result FC from the register 180. According to the final comparing result FC, the counter 162 counts a value indicating a number of bits, having a same logic value, of the final comparing result FC. In some embodiments, the same logic value is "1." In other words, if the final comparing result FC has 4 bits having logic value "1," the counter 162 outputs data indicating the value 4 to the maximum hamming distance generating circuit 164. In some embodiments, the counter 162 is implemented by a population counter composed of a number of adders (not shown). In some other embodiments, the counter 162 is implemented by other logic gates.

Then, the maximum hamming distance generating circuit 164 generates the maximum hamming distance HD according to the aforementioned value and a total bit number of the final comparing result FC. The maximum hamming distance HD represents a maximum difference between two of the responses from the under-test device 105. In some embodiments, the maximum hamming distance generating circuit 164 is implemented by, or includes, a divider (not shown), but is not limited thereto. In some other embodiments, the maximum hamming distance generating circuit 164 is implemented by other logic gates.

The configurations of the calculating circuit 160 are given for illustrative purposes only. Various configurations of the calculating circuit 160 are within the contemplated scope of the present disclosure.

Moreover, the configuration of the device 100 in FIG. 1 is given for illustrative purposes. Various configurations of the device 100 are within the contemplated scope of the present disclosure.

Figure 2:
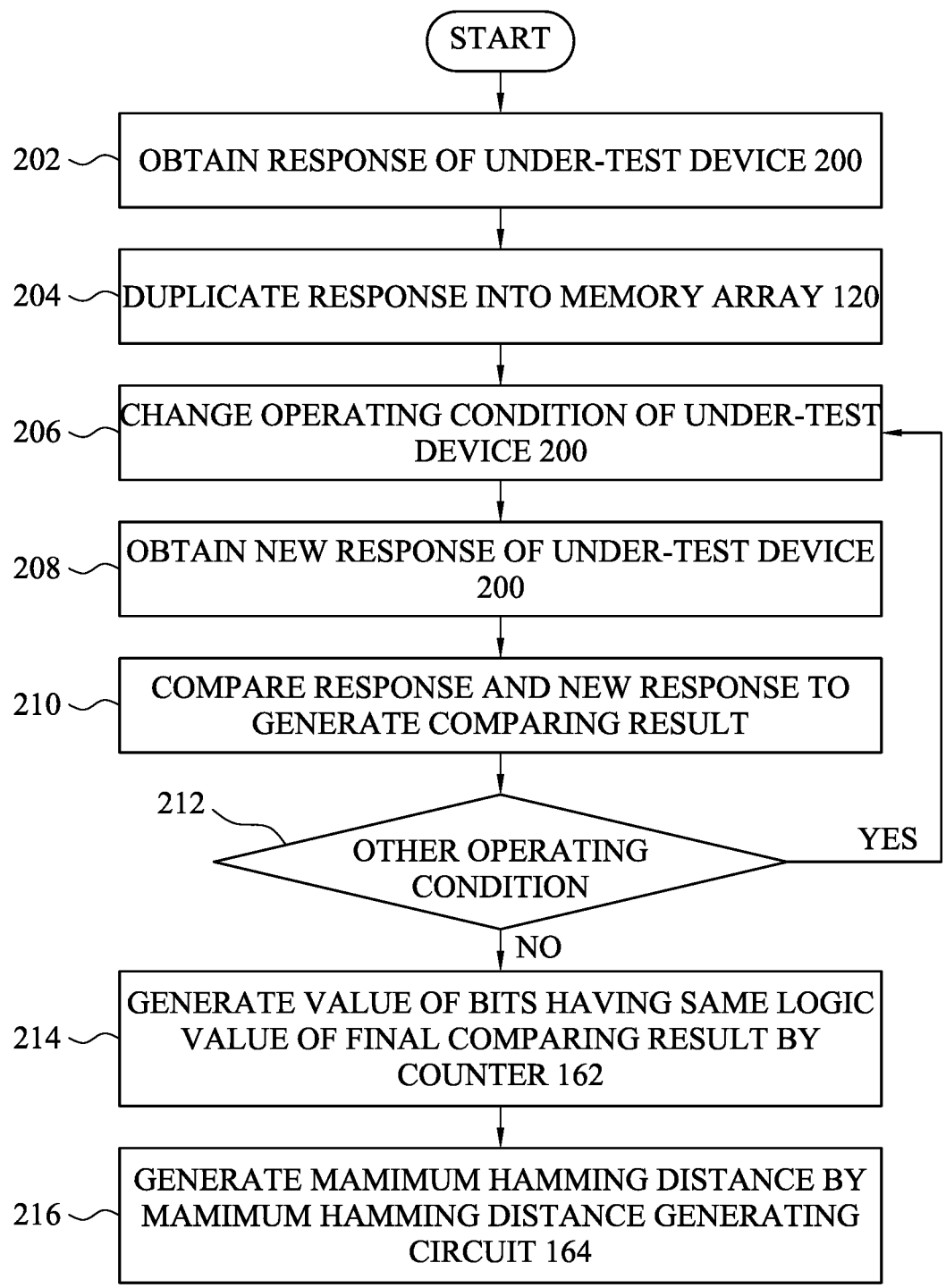
FIG. 2 is a flow chart of a method illustrating operations of the device with the under-test device in FIG. 1, in accordance with various embodiments of the present disclosure.
Figure 3:
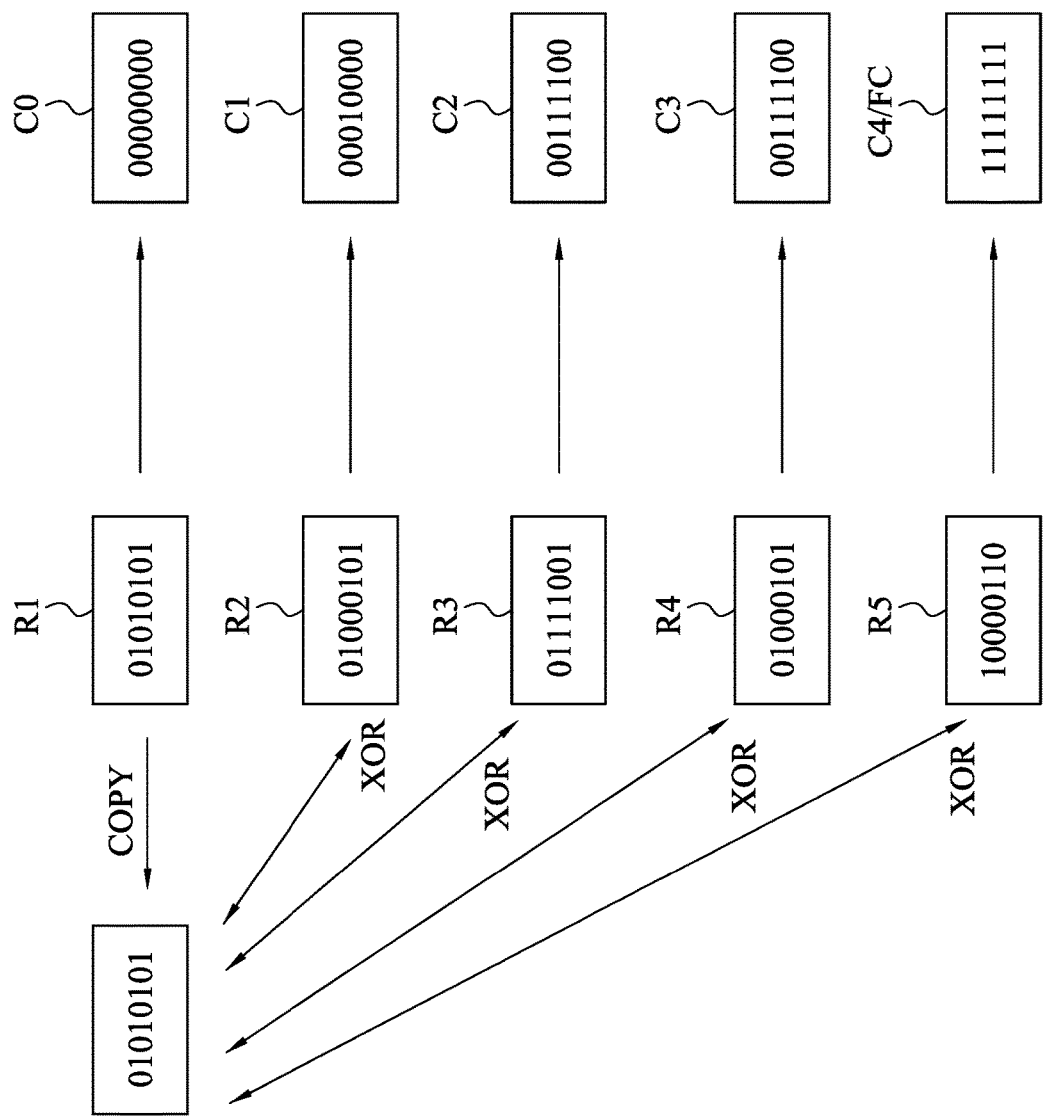
FIG. 3 is a schematic diagram illustrating a comparing procedure with respect to the device and the under-test device in FIG. 1, in accordance with various embodiments of the present disclosure.

Reference is made to FIG. 2 and FIG. 3. FIG. 2 is a flow chart of a method 200 illustrating operations of the device 100 with the under-test device 105 in FIG. 1, in accordance with various embodiments of the present disclosure. FIG. 3 is a schematic diagram illustrating a comparing procedure with respect to the device 100 and the under-test device 105 in FIG. 1, in accordance with various embodiments of the present disclosure.

The operations between the device 100 and the under-test device 105 in FIG. 1 are described below by the method 200 illustrated in FIG. 2. For better understanding of the present disclosure, the method 200 is discussed with reference to FIG. 1 and FIG. 3.

In operation 202, when the under-test device 105 operates in a first operating condition, a response R1 of the under-test device 105 is obtained. In some embodiments, the first operating condition is an initial operating condition of the under-test device 105, but is not limited thereto. Accordingly, the response R1 is the content of the under-test device 105 operating in the initial operating condition. As illustratively shown in FIG. 3, the response R1 is 01010101. Explained in another way, when the under-test device 105 operates in the initial operating condition, the content of the under-test device 105 is 01010101. Moreover, when the under-test device 105 operates in the first operating condition, an initial reference C0 in the register 180 is reset to be 0000000.

The number of bits of the response R1 and other responses of the under-test device 105 is given for illustrative purposes only. Various numbers of bits of the response R1 and other responses of the under-test device 105 are within the contemplated scope of the present disclosure. For example, in some other embodiments, the response R1 or each one of other responses of the under-test device 105 has less than eight bits or more than eight bits.

In operation 204, the response R1 is duplicated into the memory array 120. In some embodiments, the response R1 is copied or duplicated from the under-test device 105 and retained in the memory array 120. In other words, the response R1 of 01010101 is stored in the memory array 120 and is invariable, for illustration, during the following operations. In various embodiments, the memory array 120 is a duplicate of the under-test device 105, and accordingly, the memory array 120 generates at least one response which is the same as that from the under-test device 105.

In operation 206, the operating condition of the under-test device 105 is changed. For example, the operating condition of the under-test device 105 is changed from the first operating condition to a second operating condition. In some embodiments, the second operating condition is different from the first operating condition.

In operation 208, a new response of the under-test device 105 is obtained. As described above, when the operating condition of the under-test device 105 is changed, the content in the under-test device 105 changes accordingly. In some embodiments, a new response R2 is referred to as the changed content in the under-test device 105. For illustration, the response R2 of the under-test device 105 is 01000101.

In operation 210, the comparing circuit 140 compares the response R1 and the response R2 of the under-test device 105, to generate a comparing result C1. In some embodiments, the exclusive OR gate 142 performs an exclusive OR operation of each of bits of the response R1 and a corresponding bit of bits of the response R2 to adjust the initial reference C0, such that the initial reference C0 is adjusted to be the comparing result C1.

For illustration with reference to FIG. 3, the exclusive OR gate 142 performs the exclusive OR operation on a first bit of the response R1 and a first bit of the response R2. In some embodiments, the first bit is referred to as the rightmost bit of the eight bits in, for example, the response R1 shown in FIG. 3, and a second bit is referred to as the bit next to the rightmost bit of the eight bits in the response R1, and so on. For illustration in FIG. 3, the first bit of the response R1 and the first bit of the response R2 have the same logic value "1," and accordingly, a result of the exclusive OR operation on these two bits is the logic value "0." Accordingly, a first bit of the comparing result C1 is remained having the logic value "0," which is the same as the first bit of the initial reference C0.

Then, the exclusive OR gate 142 performs an exclusive OR operation on a second bit of the response R1 and a second bit of the response R2. Since the second bit of the response R1 and the second bit of the response R2 have the same logic value "0," and accordingly, a result of the exclusive OR operation on these two bits is the logic value "0." Accordingly, a second bit of the comparing result C1 is remained having the logic value "0," which is the same as the second bit of the initial reference C0.

Correspondingly, a third bit of the comparing result C1, a fourth bit of the comparing result C1, a sixth bit of the comparing result C1, a seventh bit of the comparing result C1, an eighth bit of the comparing result C1 are remained having the logic value "0."

For illustration, a fifth bit of the response R1 has the logic value "1," but a fifth bit of the response R2 has the logic value "0," and accordingly, a result of the exclusive OR operation on these two bits is the logic value "1." Accordingly, a fifth bit of the comparing result C1 is transiting from the logic value "0" to the logic value "1."

As a result, the initial reference C0 is adjusted to be the comparing result C1. The comparing result C1 is 00010000. The comparing result C1 is temporarily stored in the register 180.

In operation 212, it is determined that whether or not there is other operating condition for testing the under-test device 105. In some embodiments, the determination is made by a controller (not shown) or a processing circuit (not shown), but is not limited thereto. If there is another operating condition (for example, a third operating condition) for testing, operation 206 is performed again. In other words, the operating condition of the under-test device 105 is changed from the second operating condition to the third operating condition. In some embodiments, the third operating condition is different from the second operating condition, and is also different from the first operating condition.

When the under-test device 105 operates in the third operating condition, a new response of the under-test device 105 is obtained. As illustratively shown in FIG. 3, the new response R3 of the under-test device 105 is 01111001. Then, the exclusive OR gate 142 performs an exclusive operation on the response R1, stored in the memory array 120, and the response R3.

In some embodiments, if an Xth bit of one comparing result has a determined logic value (for example, the logic value "1"), an Xth bit of following comparing results is retained. For illustration, the fifth bit of the comparing result C1 has the logic value "1." Regardless of a result of an exclusive OR operation on a fifth bit of the response R1 and a fifth bit of the response R3, a fifth bit of a following comparing result C2 is retained having the logic value "1," as illustrated in FIG. 3.

In addition, if a Yth bit of one comparing result has a specific logic value (for example, the logic value "0"), a Yth bit of following comparing results has a chance to be changed. In some embodiments, X and Y are positive integers. For illustration, each one of the responses, as discussed above, has n bits. X and Y are smaller than or equal to n, and Y is different from X.

For illustration, since the first bit of the response R1 and a first bit of the response R3 have the same logic value (for example, logic value "0"), and accordingly, a result of the exclusive OR operation on these two bits is the logic value "0." Accordingly, a first bit of the comparing result C2 is remained having the logic value of 0.

Correspondingly, a second bit of the comparing result C2, a seven bit of the comparing result C2, and an eighth bit of the comparing result C2 are remained having the logic value "0."

For illustration, since a third bit of the response R1 and a third bit of the response R3 have different logic values respectively, and accordingly, a result of the exclusive OR operation on these two bits is the logic value "1." Accordingly, a third bit of the comparing result C2 is changed to be the logic value "1."

Correspondingly, a third bit of the comparing result C2, a fourth bit of the comparing result C2, and a sixth bit of the comparing result C2 are changed to be the logic value "1."

As a result, the comparing result C1 of 00010000 is adjusted, to form the comparing result C2 of 00111100. The comparing result C2 is temporarily stored in the register 180. Explained in another way, the comparing result C2 is generated by adjusting the previous comparing result C1.

After the comparing result C2 is generated, if there is further another operating condition (for example, a fourth operating condition) for testing, operation 206 is entered again. Then, the under-test device 105 operates in the fourth operating condition. A corresponding response R4 is accordingly obtained. In some embodiments, the fourth operating condition is different from the aforementioned operating conditions.

As illustratively shown in FIG. 3, the new response R4 of the under-test device 105 is 01000101. Then, the exclusive OR gate 142 performs an exclusive operation on the response R1 from the memory array 120 and the response R4.

For illustration in FIG. 3, only a fifth bit of the response R4 and a corresponding bit of the response R1 have different logic values from each other. The fifth bit of the comparing result C2 has the logic value "1." Accordingly, the fifth bit of the comparing result C3 still has the logic value "1." Each one of other bits of the response R4 has a same logic value with a corresponding bit of the response R1. Accordingly, other bits of the comparing result C3 are retained. As a result, the comparing result C3 is the same as the comparing result C2. The comparing result C3 is temporarily stored in the register 180.

After the comparing result C3 is generated, if there is yet another operating condition (for example, a fifth operating condition) for testing, operation 206 is entered again. Then, the operating condition of the under-test device 105 is changed from the fourth operating condition to the fifth operating condition. A corresponding response R5 is accordingly obtained. In some embodiments, the fifth operating condition is different from the aforementioned operating conditions.

For illustration in FIG. 3, the new response R5 of the under-test device 105 is 10000110. Then, the exclusive OR gate 142 performs an exclusive operation on the response R1 from the memory array 120 and the response R5.

A first bit of the response R5 and a first bit of the response R1 have different logic value. Accordingly, a first bit of the comparing result C4 is adjusted to be the logic value "1." Correspondingly, a second bit of the comparing result C4, a seventh bit of the comparing result C4, and an eighth bit of the comparing result C4 are adjusted to be the logic value "1." As a result, the comparing result C3 of 00111100 is adjusted, to form the comparing result C4 of 11111111. The comparing result C4 is temporarily stored in the register 180.

For illustration in FIG. 3, after the comparing result C4 is generated, if there is no operating condition for testing, operation 214 of the method 200 is performed. The comparing result C4 is referred to as the aforementioned final comparing result FC.

In some other embodiments, the comparing circuit 140 includes a plurality of exclusive OR gates 142. For illustration, the comparing circuit 140 includes eight exclusive OR gates 142. Each of the exclusive OR gates performs an exclusive OR operation of a corresponding bit of the response R1 and a corresponding bit of one of the responses.

The number of the exclusive OR gates 142 in the comparing circuit 140 are given for illustrative purposes only. Various numbers of the exclusive OR gates 142 in the comparing circuit 140 are within the contemplated scope of the present disclosure.

In operation 214, the counter 162 generates a value with respect to the bits, having a same logic value, in the comparing result C4. In some embodiments, the same logic value of the bits in the comparing result C4 is the logic value "1." Explained in another way, the counter 162 counts the number of bits having the logic value "1" in the comparing result FC. For illustration, the comparing result FC is 11111111. As a result, the value counted by the counter 162 is equal to a value 8. As described above, in some embodiments, the counter 162 is implemented by the population counter composed of a plurality of adders (not shown). Accordingly, in these embodiments, the value of 8 is in binary form, for example, 1000, but is not limited thereto.

In operation 216, the maximum hamming distance generating circuit 164 generates the maximum hamming distance HD according the value from the counter 162 and a total bit number of the comparing result FC. For illustration, the maximum hamming distance generating circuit 164 calculates a ratio of the value generated from the counter 162 to a total bit number of the comparing result FC. Explained in another way, if the comparing result C4 has n bits, and the comparing result C4 has m bits having the logic value of 1, the maximum hamming distance HD is substantially equal to m/n, where m and n are positive integers.

In some embodiments, the maximum hamming distance HD is represented in form of percentage. As illustratively shown in FIG. 3, the total bit number of the comparing result FC is 8. The bit number of bits having the logic value "1," in the comparing result FC, is also 8. Accordingly, the maximum hamming distance HD is 100%.

The above description of the method 200 includes exemplary operations, but the operations of the method 200 are not necessarily performed in the order described. The order of the operations of the method 200 disclosed in the present disclosure are able to be changed, or the operations are able to be executed simultaneously or partially simultaneously as appropriate, in accordance with the spirit and scope of various embodiments of the present disclosure.

Moreover, since the aforementioned maximum hamming distance HD is generated according to the responses of the same under-test device 105, the maximum hamming distance HD is an intra-hamming distance of the under-test device 105 in some embodiments. The maximum hamming distance HD represents a maximum difference between any two of the responses R1-R5 as illustrated in FIG. 3. For illustration in FIG. 3, among the responses R1-R5 of the under-test device 105, all bits of the response R3 are different from corresponding bits of the response R5, respectively. In other words, the difference between the response R3 and the response R5 is 100%. Accordingly, the maximum hamming distance HD of the under-test device 105 is 100%.

In some embodiments, when the maximum hamming distance HD of an under-test equipment is 0%, it represents that the under-test equipment is perfectly repeatable and robust in different operating environments.

In some embodiments, when the maximum hamming distance HD is higher than a predetermined value, the under-test device 105 needs to be modified or debugged. The predetermined value is able to be adjusted dynamically, but is not limited thereto.

In some embodiments, the device 100 and the under-test device 105 are disposed on a same chip or a same wafer. Accordingly, the device 100 measures the under-test device 105 directly on the chip or the wafer. In some embodiments, the device 100 measures the under-test device 105 at wafer acceptance testing (WAT) stage.

With the device 100 discussed in the present disclosure, the device 100 measures the under-test device 105 online without downloading any response of the under-test device 105. In addition, only the maximum hamming distance HD is outputted. Therefore, time for downloading responses is saved, and storage space for storing the downloaded responses is also saved.

Figure 4:
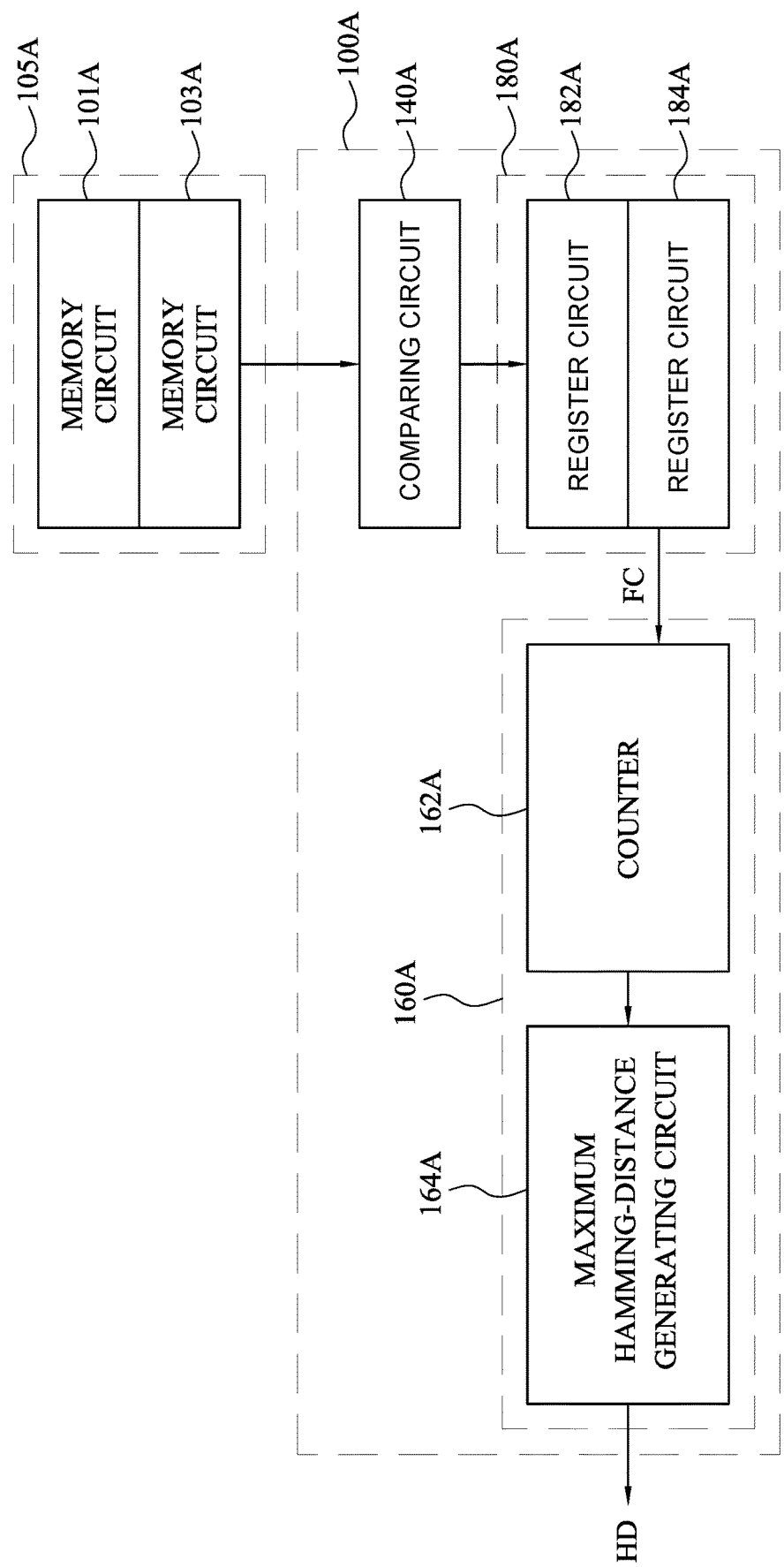
FIG. 4 is a schematic diagram of a device and a memory, in accordance with various embodiments of the present disclosure.

Reference is now made to FIG. 4. FIG. 4 is a schematic diagram of a device 100A and a memory 105A, in accordance with various embodiments of the present disclosure.

In some embodiments, the device 100A is a test device. The device 100A is configured to test a robustness of the memory 105A. In some embodiments, the device 100A is applied in, or implemented as, an intra-hamming distance analyzer. The device 100A is configured to generate a maximum hamming distance HD of the memory 105A. The maximum hamming distance HD represents the robustness of the memory 105A. In some embodiments, the hamming distance HD indicates a number of bits that are different between two binary strings.

In some embodiments, the memory 105A is, for example, a static random access memory (SRAM), a flash, or the like, but is not limited thereto. Various memory arrays or units used to implement or implemented in the memory 105A are within the contemplated scope of the present disclosure. In some other embodiments, the memory 105A includes a memory circuit 101A and a memory circuit 103A. In some embodiments, the memory circuit 101A is an under-test device.

In some embodiments, the memory circuit 101A and the memory circuit 103A operate in various operating conditions according to the practical applications. The various conditions correspond to various operating environments. For illustration, various operating conditions include various supply voltages, various operating temperatures, various operating frequencies, or the combination thereof.

As illustratively shown in FIG. 4, in some embodiments, the device 100A includes a comparing circuit 140A and a calculating circuit 160A. In some embodiments, the device 100A further includes a register 180A. The comparing circuit 140A is coupled to the memory 105A. The register 180A is coupled to the comparing circuit 140A. The calculating circuit 160A is coupled to the register 180A. In some embodiments, the comparing circuit 140A includes an XOR gate or is implemented by an XOR gate.

The above discussion merely describes exemplary connections that can be made in accordance with various alternative embodiments. It is understood that such various alternative embodiments are not limited to the specific connections described above or those shown in FIG. 4.

As illustratively shown in FIG. 4, the memory circuit 103A is configured to generate at least one response of the memory circuit 101A, and to store the at least one response. In some embodiments, the at least one response is copied or duplicated from the memory circuit 101A into the memory circuit 103A. In some embodiments, the memory circuit 103A is a duplicate of the memory circuit 101A, and accordingly, the memory circuit 103A generates at least one response which is the same as that from the memory circuit 101A.

As illustratively shown in FIG. 4, the comparing circuit 140A receives the response from the memory circuit 103A. In some embodiments, the comparing circuit 140A also receives responses, obtained in different operating conditions, from the memory circuit 101A. The comparing circuit 140A is configured to compare the response from the memory circuit 103A with the responses from the memory circuit 101A sequentially, to generate corresponding comparing results.

In some embodiments, the comparing circuit 140A is configured to perform an exclusive OR (XOR) operation of the response from the memory circuit 103A and the responses from the memory circuit 101A sequentially, to generate the corresponding comparing results. These comparing results are outputted to the register 180A. In some embodiments, the roles of the memory circuit 101A and the memory circuit 103A are exchanged when the comparing results are obtained, and the foregoing operations are performed again.

As illustratively shown in FIG. 4, the register 180A is configured to temporarily store the comparing results generated from the comparing circuit 140A. Subsequently, the register 180A generates a final comparing result FC according to the comparing results. In some embodiments, the final comparing result FC indicates a comparing result which is generated by comparing the response from the memory circuit 103A with a final response from the memory circuit 101A.

In some embodiments, the register 180A includes a register circuit 182A and a register circuit 184A. The register circuit 182A is configured to temporarily store the comparing results generated by comparing the response from the memory circuit 103A with the responses from the memory circuit 101A obtained in different operating conditions. The register circuit 184A is configured to temporarily store the comparing results generated by comparing the response from the memory circuit 101A with the responses from the memory circuit 103A obtained in different operating conditions.

As illustratively shown in FIG. 4, the calculating circuit 160A is configured to receive the final comparing result FC from the register circuits 182A, 184A. The calculating circuit 160A is further configured to output the maximum hamming distance HD according to the final comparing result FC. The maximum hamming distance HD represents a maximum difference between two of the responses from the memory circuit 101A and two of the responses from the memory circuit 103A.

As illustratively shown in FIG. 4, in some embodiments, the calculating circuit 160A includes a counter 162A and a maximum hamming distance generating circuit 164A. The counter 162A is coupled to the register circuits 182A, 184A. The maximum hamming distance generating circuit 164A is coupled to the counter 162A.

The counter 162A is configured to receive the aforementioned final comparing result FC from the register circuits 182A, 184A. According to the final comparing result FC, the counter 162A counts a value indicating a number of bits, having a same logic value, of the final comparing result FC. In some embodiments, the same logic value is "1." In other words, if the final comparing result FC has 4 bits having logic value "1," the counter 162A outputs data indicating the value 4 to the maximum hamming distance generating circuit 164A. In some embodiments, the counter 162A is implemented by a population counter composed of a number of adders (not shown). In some other embodiments, the counter 162A is implemented by other logic gates.

Then, the maximum hamming distance generating circuit 164A generates the maximum hamming distance HD according to the aforementioned value and a total bit number of the final comparing result FC. The maximum hamming distance HD represents a maximum difference between two of the responses from the memory circuit 101A. In some embodiments, the maximum hamming distance generating circuit 164A is implemented by, or includes, a divider (not shown), but is not limited thereto. In some other embodiments, the maximum hamming distance generating circuit 164A is implemented by other logic gates.

Figure 5:
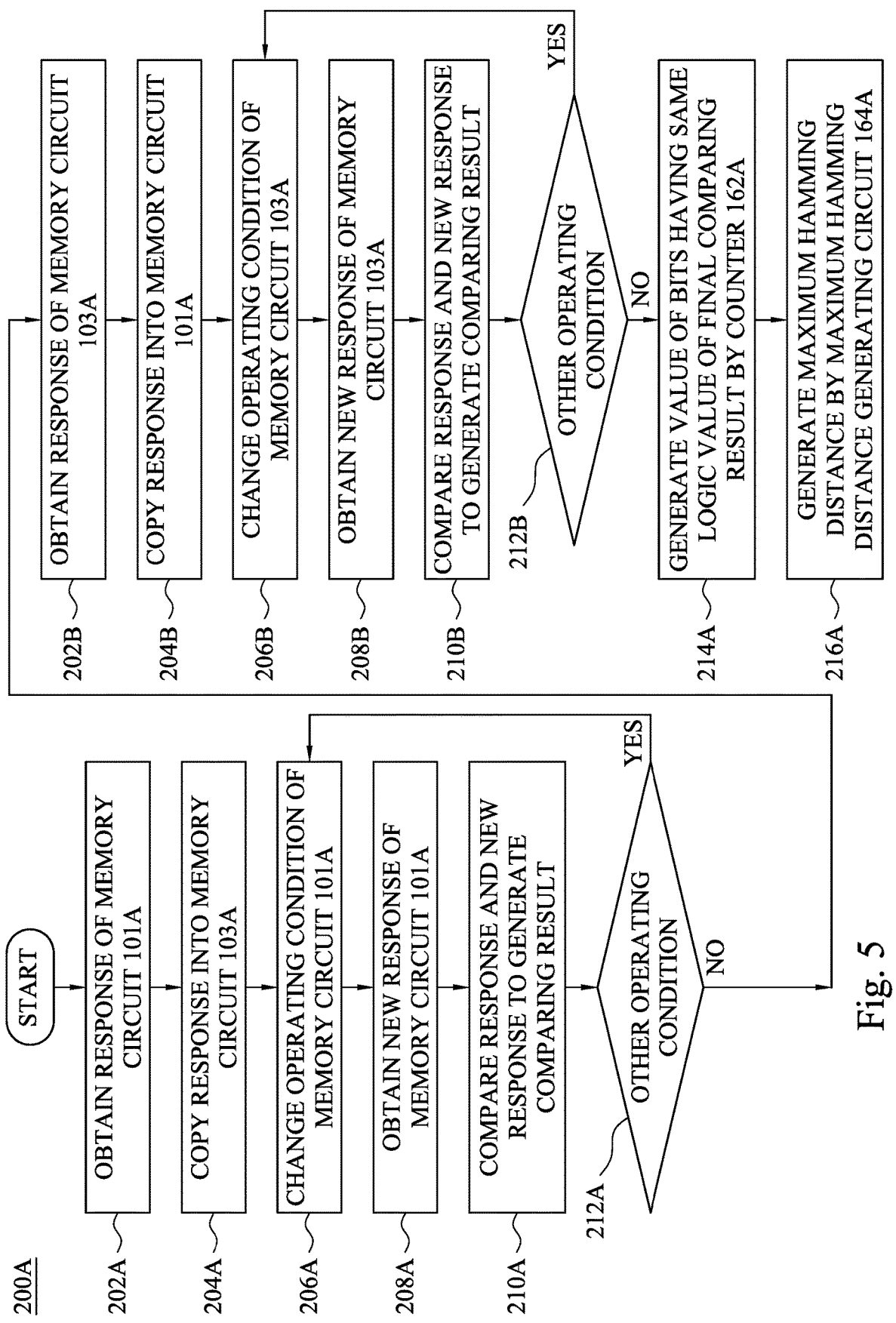
FIG. 5 is a flow chart of a method illustrating operations of the device with the memory in FIG. 4, in accordance with various embodiments of the present disclosure.

Reference is made to FIG. 5. FIG. 5 is a flow chart of a method 200A illustrating operations of the device 100A with the memory 105A in FIG. 4, in accordance with various embodiments of the present disclosure.

The operations between the device 100A and the memory 105A in FIG. 4 are described below by the method 200A illustrated in FIG. 5. For ease of understanding, the method 200A is discussed with reference to FIG. 4.

In operation 202A, when the memory circuit 101A operates in a first operating condition, a response of the memory circuit 101A is obtained. In some embodiments, the first operating condition is an initial operating condition of the memory circuit 101A, but is not limited thereto.

In operation 204A, the response is copied or duplicated into the memory circuit 103A. In some embodiments, the response is copied or duplicated from the memory circuit 101A and retained in the memory circuit 103A.

In operation 206A, the operating condition of the memory circuit 101A is changed. For example, the operating condition of the memory circuit 101A is changed from the first operating condition to a second operating condition. In some embodiments, the second operating condition is different from the first operating condition.

In operation 208A, a new response of the memory circuit 101A is obtained. As described above, when the operating condition of the memory circuit 101A is changed, the content in the memory circuit 101A changes accordingly.

In operation 210A, the comparing circuit 140A compares the new response and the response of the memory circuit 103A, to generate a comparing result.

In operation 212A, it is determined that whether or not there is other operating condition for testing the memory circuit 101A. In some embodiments, the determination is made by a controller (not shown) or a processing circuit (not shown), but is not limited thereto. If there is another operating condition (for example, a third operating condition) for testing, operation 206A is performed again. In other words, the operating condition of the memory circuit 101A is changed from the second operating condition to the third operating condition. In some embodiments, the third operating condition is different from the second operating condition, and is also different from the first operating condition.

If there is no other operating condition for testing, operation 202B of the method 200A is performed. In some embodiments, the roles of the memory circuit 101A and the memory circuit 103A are exchanged, which will be described below.

In operation 202B, when the memory circuit 103A operates in a first corresponding operating condition, a response of the memory circuit 103A is obtained.

In operation 204B, the response is copied or duplicated into the memory circuit 101A. In some embodiments, the response is copied or duplicated from the memory circuit 103A and retained in the memory circuit 101A.

In operation 206B, the operating condition of the memory circuit 103A is changed. For example, the operating condition of the memory circuit 103A is changed from the first corresponding operating condition to a second corresponding operating condition. In some embodiments, the second corresponding operating condition is different from the first corresponding operating condition.

In operation 208B, a new response of the memory circuit 103A is obtained. As described above, when the operating condition of the memory circuit 103A is changed, the content in the memory circuit 103A changes accordingly.

In operation 210B, the comparing circuit 140A compares the new response and the response of the memory circuit 103A, to generate a comparing result.

In operation 212B, it is determined that whether or not there is other operating condition for testing the memory circuit 103A. If there is another operating condition (for example, a third corresponding operating condition) for testing, operation 206B is performed again.

If there is no operating condition for testing, operation 214A of the method 200A is performed.

In operation 214A, the counter 162A generates a value with respect to the bits, having a same logic value, in the comparing result. In some embodiments, the same logic value of the bits in the comparing result is the logic value "1." Explained in another way, the counter 162A counts the number of bits having the logic value "1" in the comparing result FC. For illustration, the comparing result FC is 11111111. As a result, the value counted by the counter 162A is equal to a value 8. As described above, in some embodiments, the counter 162A is implemented by the population counter composed of a plurality of adders (not shown). Accordingly, in these embodiments, the value of 8 is in binary form, for example, 1000, but is not limited thereto.

In operation 216A, the maximum hamming distance generating circuit 164A generates the maximum hamming distance HD according to the value from the counter 162A and a total bit number of the comparing result FC. For illustration, the maximum hamming distance generating circuit 164A calculates a ratio of the value generated from the counter 162A to a total bit number of the comparing result FC. Explained in another way, if the comparing result has n bits, and the comparing result has m bits having the logic value of 1, the maximum hamming distance HD is substantially equal to m/n, where m and n are positive integers.

Compared to FIG. 1 illustrating the memory array 120 and the under-test device 105 which, in some embodiments, is an under-test memory array, the embodiments in FIG. 4 illustrate only one memory 105A which includes the memory circuits 101A and 103A that are configured as a memory array and an under-test device, respectively, and vice versa. With the embodiments in FIG. 4, the memory 105A is able to be configured as an under-test device for generating PUF bits, as well as memory array for storing the response from the under-test device. Accordingly, the overall area for the device in FIG. 4 is able to be reduced.

In some embodiments, a device is disclosed for testing a memory, in which the memory includes a first memory circuit and a second memory circuit. The second memory circuit is configured to store a first response in responses of the first memory circuit, and the first memory circuit is configured to store a second response of responses of the second memory circuit. The device includes a comparing circuit and a maximum hamming distance generating circuit. The comparing circuit is configured to compare the first response with the responses of the first memory circuit, and configured to compare the second response with the responses of the second memory circuit, to generate comparing results. The maximum hamming distance generating circuit is configured to generate a maximum hamming distance according to the comparing results.

In various embodiments, the comparing circuit is configured to compare the first response with the responses of the first memory circuit to generate first comparing results of the comparing results, and configured to compare the second response with the responses of the second memory circuit to generate second comparing results of the comparing results.

In various embodiments, the device further includes a register configured to store the comparing results for the generation of the maximum hamming distance. The register includes a first registering circuit and a second registering circuit. The first registering circuit is configured to store the first comparing results. The second registering circuit is configured to store the plurality of second comparing results.

In various embodiments, the comparing circuit includes an exclusive OR gate configured to perform an exclusive OR operation of the first response and each one of the responses of the first memory circuit, and configured to perform an exclusive OR operation of the second response and each one of the responses of the second memory circuit.

In various embodiments, the comparing circuit is further configured to generate a final comparing result according to the comparing results, in which an Xth bit of a first comparing result of the comparing results, which is generated prior to a second comparing result of the comparing results, has a first logic value, and an Xth bit of the second comparing result is configured to have the first logic value.

In various embodiments, the device further includes a counter configured to receive the final comparing result, and configured to generate a first value indicating a number of bits, having the first logic value, of the final comparing result.

In various embodiments, the maximum hamming distance generating circuit is configured to generate a maximum hamming distance further according to the first value and a bit number of the final comparing result.

Also disclosed is a method that includes the operations of: comparing a first response stored in a first memory circuit with responses of a second memory circuit, to generate first comparing results; comparing a second response stored in the second memory circuit with responses of the first memory circuit, to generate second comparing results; and obtaining a maximum difference between two of the responses of the second memory circuit according to the first comparing results and the second comparing results.

In various embodiments, the method further includes generating a final comparing result according to the the first comparing results and the second comparing results.

In various embodiments, obtaining the maximum difference includes the operations of: generating a first value indicating a number of bits, having a first logic value, of the final comparing result; and generating a maximum hamming distance according to the first value and a bit number of the final comparing result, in which the maximum hamming distance represents the maximum difference.

In various embodiments, comparing the first response stored in the first memory circuit with the responses of the second memory circuit includes the operations of: performing an exclusive OR operation of the first response stored in the first memory circuit and each one of the responses of the second memory circuit, to generate the first comparing results; and performing an exclusive OR operation of the second response stored in the second memory circuit and each one of the responses of the first memory circuit, to generate the second comparing results.

In various embodiments, when an Xth bit of a first comparing result, which is generated prior to a second comparing result, of first comparing results, has a first logic value, and an Xth bit of the second comparing result is configured to have the first logic value, and when an Yth bit of a third comparing result, which is generated prior to a fourth comparing result, of the second comparing results, has the first logic value, and a Yth bit of the fourth comparing result is configured to have the first logic value.

In various embodiments, the method further includes the operations of: retaining the first response of the responses of the second memory circuit in a first operating condition of operating conditions; and retaining the second response of the responses of the first memory circuit in a second operating condition of the operating conditions.

In various embodiments, the operating conditions correspond to different operating environments.

Also disclosed is a method that includes the operations of: performing an exclusive OR operation of a first response of responses of a first memory circuit and the responses of the first memory circuit, to generate first comparing results, in which the first response is stored in a second memory circuit; performing an exclusive OR operation of a second response of responses of the second memory circuit and the responses of the second memory circuit, to generate second comparing results, in which the second response is stored in the first memory circuit; and outputting, according to the first comparing results and the second comparing results, a maximum hamming distance between two of the responses of the first memory circuit.

In various embodiments, when an Xth bit of a first comparing result, which is generated prior to a second comparing result of the first comparing results, of the first comparing results, has a first logic value, and an Xth bit of the second comparing result is configured to have the first logic value. When an Yth bit of a third comparing result, which is generated prior to a fourth comparing result of the second comparing results, of the second comparing results, has the first logic value, and a Yth bit of the fourth comparing result is configured to have the first logic value.

In various embodiments, the first logic value is 1.

In various embodiments, the method further includes generating a final comparing result according to the first comparing results and the second comparing results.

In various embodiments, the method further includes generating a value indicating a number of bits, having a first logic value, of the final comparing result. Outputting the maximum hamming distance includes calculating a ratio of the value to a bit number of the final comparing result, in which the ratio represents the maximum hamming distance.

In various embodiments, the method further includes the operations of: operating the first memory circuit of a memory in operating conditions corresponding to different operating environments, to obtain the responses of the first memory circuit, and storing the first response of the responses of the first memory circuit in the second memory circuit of the memory; and operating the second memory circuit in operating conditions corresponding to the different operating environments, to obtain the responses of the second memory circuit, and storing the second response of the responses of the second memory circuit in the first memory circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device for testing a memory, wherein the memory comprises a first memory circuit and a second memory circuit, wherein the second memory circuit is configured to store a first response in a plurality of responses of the first memory circuit, and the first memory circuit is configured to store a second response in a plurality of responses of the second memory circuit, wherein the device comprises:
   a comparing circuit configured to compare the first response with the plurality of responses of the first memory circuit, and configured to compare the second response with the plurality of responses of the second memory circuit, to generate a plurality of comparing results,
   wherein the comparing circuit is configured to perform an exclusive OR operation of the first response and each one of the plurality of responses of the first memory circuit to generate the plurality of comparing results, and further configured to generate a final comparing result according to the plurality of comparing results; and
   a maximum hamming distance generating circuit configured to generate a maximum hamming distance according to a number of bits having a first logic value of the final comparing result.

2. The device of claim 1, wherein the comparing circuit is configured to compare the first response with the plurality of responses of the first memory circuit to generate a plurality of first comparing results of the plurality of comparing results, and configured to compare the second response with the plurality of responses of the second memory circuit to generate a plurality of second comparing results of the plurality of comparing results.

3. The device of claim 2, further comprising:
   a register configured to store the plurality of comparing results for the generation of the maximum hamming distance, wherein the register comprises:
      a first registering circuit configured to store the plurality of first comparing results; and
      a second registering circuit configured to store the plurality of second comparing results.

4. The device of claim 1, wherein the comparing circuit comprises:
   an exclusive OR gate configured to perform the exclusive OR operation of the first response and each one of the plurality of the responses of the first memory circuit, and configured to perform an exclusive OR operation of the second response and each one of the plurality of the responses of the second memory circuit.

5. The device of claim 4, wherein an Xth bit of a first comparing result of the plurality of comparing results, which is generated prior to a second comparing result of the plurality of comparing results, has the first logic value, and an Xth bit of the second comparing result is configured to have the first logic value.

6. The device of claim 5, further comprising:
   a counter configured to receive the final comparing result, and configured to generate a first value indicating the number of bits, having the first logic value, of the final comparing result.

7. The device of claim 6, wherein the maximum hamming distance generating circuit is configured to generate the maximum hamming distance further according to the first value and a bit number of the final comparing result.

8. A method, comprising:
   comparing, by performing a first exclusive OR operation, a first response, stored in a first memory circuit, of a second memory circuit, with a plurality of responses of the second memory circuit, to generate a plurality of first comparing results;
   comparing a second response, stored in the second memory circuit, of the first memory circuit, with a plurality of responses of the first memory circuit, to generate a plurality of second comparing results;
   generating a final comparing result according to at least the plurality of the first comparing results; and
   obtaining a maximum difference between two of the plurality of responses of the second memory circuit according to a number of bits having a first logic value of the final comparing result.

9. The method of claim 8, wherein generating the final comparing result comprises:
   generating the final comparing result according to the plurality of second comparing results.

10. The method of claim 9, wherein obtaining the maximum difference comprises:
    generating a first value indicating a number of bits, having the first logic value, of the final comparing result; and
    generating a maximum hamming distance according to the first value and a bit number of the final comparing result, wherein the maximum hamming distance represents the maximum difference.

11. The method of claim 8, wherein comparing the second response with the plurality of responses of the first memory circuit comprises:
    performing a second exclusive OR operation of the second response stored in the second memory circuit and each one of the plurality of responses of the first memory circuit, to generate the plurality of second comparing results.

12. The method of claim 11, wherein when an Xth bit of a first comparing result, which is generated prior to a second comparing result, of the plurality of first comparing results, has the first logic value, and an Xth bit of the second comparing result is configured to have the first logic value, and when an Yth bit of a third comparing result, which is generated prior to a fourth comparing result, of the plurality of second comparing results, has the first logic value, and a Yth bit of the fourth comparing result is configured to have the first logic value.

13. The method of claim 8, further comprising:

retaining the first response of the plurality of responses of the second memory circuit in a first operating condition of a plurality of operating conditions; and retaining the second response of the plurality of responses of the first memory circuit in a second operating condition of the plurality of operating conditions.

14. The method of claim 13, wherein the plurality of operating conditions correspond to different operating environments.

15. A method, comprising:

performing an exclusive OR operation of a first response of a plurality of responses of a first memory circuit and the plurality of responses of the first memory circuit, to generate a plurality of first comparing results, wherein the first response is stored in a second memory circuit;

performing an exclusive OR operation of a second response of a plurality of responses of the second memory circuit and the plurality of responses of the second memory circuit, to generate a plurality of second comparing results, wherein the second response is stored in the first memory circuit;

generating a final comparing result according to at least the plurality of first comparing results; and outputting, according to a number of bits having a first logic value of the final comparing result, a maximum hamming distance between two of the plurality of responses of the first memory circuit.

16. The method of claim 15, wherein when an Xth bit of a first comparing result, which is generated prior to a second comparing result of the plurality of first comparing results, of the plurality of first comparing results, has the first logic value, and an Xth bit of the second comparing result is configured to have the first logic value, and when an Yth bit of a third comparing result, which is generated prior to a fourth comparing result of the plurality of second comparing results, of the plurality of second comparing results, has the first logic value, and a Yth bit of the fourth comparing result is configured to have the first logic value.

17. The method of claim 16, wherein the first logic value is 1.

18. The method of claim 15, wherein generating the final comparing result comprises:

generating the final comparing result according to the plurality of first comparing results and the plurality of the second comparing results.

19. The method of claim 18, further comprising:

generating a value indicating the number of bits, having the first logic value, of the final comparing result, wherein outputting the maximum hamming distance comprises:

calculating a ratio of the value to a bit number of the final comparing result, wherein the ratio represents the maximum hamming distance.

20. The method of claim 15, further comprising:

operating the first memory circuit of a memory in operating conditions corresponding to different operating environments, to obtain the plurality of responses of the first memory circuit, and storing the first response of the plurality of responses of the first memory circuit in the second memory circuit of the memory; and operating the second memory circuit in operating conditions corresponding to the different operating environments, to obtain the plurality of responses of the second memory circuit, and storing the second response of the plurality of responses of the second memory circuit in the first memory circuit.

* * * * *